(12) United States Patent
Oba et al.

(10) Patent No.: US 6,892,350 B1
(45) Date of Patent: May 10, 2005

(54) AUDIO SYSTEM WITH CUSTOMIZATION OF INFORMATION DISPLAY

(75) Inventors: Toshifumi Oba, Hamamatsu (JP); Masaya Kano, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/487,861

(22) Filed: Jan. 19, 2000

(30) Foreign Application Priority Data

Jan. 22, 1999 (JP) .......................................... 11-014902

(51) Int. Cl.⁷ .......................... G06F 3/00; G06F 15/16; G06F 17/00
(52) U.S. Cl. ...................... 715/716; 715/717; 715/727; 715/765; 715/825; 715/826; 715/866
(58) Field of Search .............................. 345/716, 717, 345/727, 762, 764, 765, 771, 773, 810, 825.07, 826, 835, 839, 840, 846, 866; 715/716, 717, 727, 762, 764, 765, 771, 773, 810, 825, 826, 835, 839, 840, 846, 866

(56) References Cited

U.S. PATENT DOCUMENTS 5,262,940 A * 11/1993 Sussman ...................... 705/28
5,365,494 A    11/1994 Lynch
5,732,338 A     3/1998 Schwob

FOREIGN PATENT DOCUMENTS

| EP | 0691740 | 1/1996 | |
|---|---|---|---|
| JP | 57-1045736 | 3/1982 | |
| JP | 58-114621 | 8/1983 | |
| JP | 64-30936 | 2/1989 | |
| JP | 64-1072608 | 3/1989 | |
| JP | 64-1072609 | 3/1989 | |
| JP | 07-007447 | 1/1995 | |
| JP | 57-113611 | 7/1995 | |
| JP | 01200969 | 7/1998 | ............ H04Q/9/00 |
| JP | 64-1072610 | 3/1999 | |

OTHER PUBLICATIONS

Japanese Patent Office Notice of Rejection—Oct. 2, 2001—Japanese Patent Application No. 2000–011317.
U.S. Appl. No. 09/189,768, filed Nov. 1998, Narusawa et al.

* cited by examiner

*Primary Examiner*—X. L. Bautista
(74) *Attorney, Agent, or Firm*—Pillsbury Winthrop LLP

(57) ABSTRACT

An audio system has a plurality of capabilities for processing an audio signal with visual indication of the capabilities by labels. In the audio system, an audio device such as amplifier and effector selectively provides the capabilities of processing an audio signal. A first storage device provisionally stores display data representative of labels corresponding to the capabilities. An editing device is operated to edit the display data so that the labels can be customized in association with the capabilities. A second storage device stores the edited display data. A selecting device selects one of the capabilities. A display device displays the label corresponding to the selected capability according to the display data stored in either of the first storage device and the second storage device.

27 Claims, 8 Drawing Sheets

AUDIO SYSTEM WITH CUSTOMIZATION OF INFORMATION DISPLAY

BACKGROUND OF THE INVENTION

The present invention generally relates to an audio system and, more particularly, to an audio system that can change display of information associated with settings of external devices connected to the system and various capabilities performed in the system.

Conventional audio systems incorporating an audio amplifier include a typical system shown in FIG. 1. This audio system AS has external device connection terminals T1 through T4 for connection with CD (Compact Disk) player, radio receiver (tuner), first auxiliary, and second auxiliary. These terminals T1 through T4 are selectively connected to an audio amplifier AM through an input selector SL. The output of the amplifier AM is sounded from a loudspeaker through a speaker terminal Ts.

The input selector SL is controlled from an operation panel PN through a CPU (Central Processing Unit) to select input audio signals from external devices according to the operation of keys or knobs disposed on the operation panel PN. The audio system AS of this type may have a display section DS such as indicators for displaying the state of connection with a selected external device.

For example, in the case where the display section DS is made of a changeable indicator, the audio system AS incorporates a ROM (Read Only Memory) that stores a table recording display data for a number of connectable external devices in the form of input selector labels such as "CD," "TUNER," "AUX1," and "AUX2". In correspondence to an input selector position currently selected by the input selector SL, one of the input selector labels "CD," "TUNER," "AUX1," and "AUX2" is displayed on a display screen. These selector labels are displayed by character fonts or a dot matrix, for example. Otherwise, the indicators corresponding to the connectable external devices in one-to-one relation are provided as the display section DS. In correspondence to an input selector position, the associated indicator labeled "CD," "TUNER," "AUX1," or "AUX2" is lighted.

Generally, in the audio systems as mentioned above, a type of an external device to be connected as an audio signal source to each of the connection terminals T1 through T4 depends on users. Under such a circumstance, generic names such as input selector labels "AUX1" and "AUX2" are assigned to the connection terminals T3 and T4, while the other connection terminals T1 and T2 are assigned with specific names such as input selector labels "CD" and "TUNER." Accordingly, for the information to be displayed or indicated on the display section DS, these default input selector labels are used as they are.

However, the conventional method in which the default selector labels are used as they are for display information or display messages does not allow users to immediately recognize a type of an external device currently connected to these terminals.

In addition, conventional amplifiers have a capability of setting many modes associated with sound effects by means of DSP (Digital Sound (or Signal) Processing), and displaying predetermined mode labels "concert hall," "jazz," "rock," "disco," and so on % according to the DSP operation modes. Some sophisticated models also have a capability of allowing users to set and reserve various DSP parameters. However, the indication thereof is fixed by a factory; it may be "prog 1" (aggregation of program No. 1), for example.

Conventional audio amplifiers incorporating radio receivers have an indicator for a tuner. Normally, this indicator displays a tuned frequency. If an audio signal from an external device other than a tuner is inputted, the external device is displayed as described above. Generally, with respect to the tuner, as the number of radio stations to be reserved in a preset memory increases, radio stations are managed as groups called of pages. One page registers the radio stations belonging to one group, thereby displaying the group of the radio stations on a page basis. For example, eight stations "1" through "8" are recorded in each of five pages "Page-A" through "Page-E" and display is made like "Page-A"(Preset 1).

As described above, the conventional audio systems may use factory-provided and ready-made names with respect to not only the input selector labels described with reference to FIG. 1 but also mode labels for the sound effect modes executed in the audio systems by the DSP and page labels for settings of various tuning functions of the radio station groups in the preset memory of radio receivers (tuners). The conventional systems use these default labels as they are. This consequently causes a problem that users cannot readily recognize which function or capability of the audio system is currently selected or set.

SUMMARY OF THE INVENTION

It is therefore an object of the present invention to provide an audio system that can change display data as desired. To be more specific, there is provided an audio system operable when displaying the setting and selection states of various functions or capabilities, for freely changing the display data so that users obtain display forms adapted to specific functions actually selected or set or display forms as desired by users.

In carrying out the invention and according to one aspect thereof, there is provided an audio system having changeable display and comprising an editing section for editing display data corresponding to capabilities provided by the audio system, a storage section for storing the edited display data, and a display section for displaying the display data stored in the storage section. According to the invention, there is further provided another storage section as a second feature that stores in advance the display data corresponding to the capabilities of the audio system in order to display the display data recorded or stored in either of the storage sections. According to the invention, there is still further provided a selecting section as a third feature for selecting one of the capabilities provided by the audio system and for displaying the display data recorded or stored in either of the storage sections in correspondence to the selected capability.

To be more specific, the present invention is applied to the selector capability provided in the audio system. According to a specific aspect of the present invention, there is provided an audio system having changeable display, and comprising a first storage section for storing beforehand display data representative of selector labels corresponding to a plurality of signal sources from which an audio signal is inputted, an editing section for editing the display data corresponding at least to one of said plurality of the signal sources, a second storage section for storing the edited display data, a selecting section for selecting one of the plurality of the signal sources from which the audio signal is inputted, and a display section for displaying the selector label in correspondence to the selected signal source according to the display data recorded or stored in the first storage section or the second storage section.

The audio system having changeable display according to the present invention is also applicable to a DSP mode selection capability, for example. According to another specific aspect of the present invention, there is provided an audio system having changeable display comprising a first storage section for storing beforehand display data representative of mode labels corresponding to a plurality of sound effect modes, an editing section for editing the display data corresponding at least to one of the plurality of the sound effect modes, a second storage section for storing the edited display data, a selecting section for selecting any one of the plurality of the sound effect modes, and a display section for displaying the mode label in correspondence to the selected sound effect mode according to the display data recorded or stored in the first storage section or the second storage section.

The audio system having changeable display according to the present invention is further applicable to a system having a programmed tuner. According to yet another specific aspect of the present invention, there is provided an audio system having changeable display, and comprising a first storage section for storing beforehand display data representative of group labels corresponding to a plurality of radio station groups registered in a preset memory of a tuner, an editing section for editing the display data corresponding at least to one of the plurality of the radio station groups, a second storage section for storing the edited display data, a selecting section for selecting one of the plurality of the radio station groups from the preset memory, and a display section for displaying the group label in correspondence to the selected radio station group according to the display data recorded or stored in the first storage section or the second storage section.

In the audio system according to the invention, the display data corresponding to the capabilities provided in the system are edited by the editing section, the edited display data are stored in the storage section, and the stored display data are displayed by the display section. This novel setup allows the user to change as desired the display data to be displayed on the display section to labels adapted to the actual capabilities or customized by the user. Further, this audio system has the storage section storing in advance the default display data corresponding to the system capabilities. This novel setup allows the user to use the prepared labels without change according to the default display data that are not edited by the editing section. Still further, with respect to two or more capabilities provided in this audio system, the display data recorded or stored in either of the first and second storage sections can be automatically displayed according to a capability selected by operation of the selecting section.

The audio system according to the invention is applied to the selector capability of the input signal sources. The display data representative of the selector labels are stored in advance in the first storage section in correspondence to plural signal sources of the audio signal, the display data representative of a selector label corresponding to at least one of these signal sources is edited by the editing section, and the edited display data is stored in the second storage section. When one of the signal sources is selected through the selecting section, the display data stored in the first or second storage section is displayed according to the selected signal source. This novel setup allows the user to change the original selector label to a customized selector label of an actually connected device or a free selector label that the user likes in order to immediately recognize what device is connected to which terminal simply by looking at the displayed label.

The audio system according to the invention is also applied to the DSP mode selecting capabilities. When the display data representative of mode labels are previously stored in the first storage section in correspondence to a plurality of sound effect modes, the display data corresponding to at least one of these sound effect modes is edited by the editing section, and the edited display data is stored in the second storage section. When a certain sound effect mode is selected by the selecting section, the display data stored in the first or second storage section is displayed by the display section according to the selected sound effect mode. This novel setup allows the user to display the customized labels of the sound effect modes.

The audio system according to the invention is also applied to the programmed tuner. When the display data representative of group labels are previously stored in the first storage section in correspondence to a plurality of radio station groups registered in a preset memory, the display data of a group label corresponding to at least one of these radio station groups is edited by the editing section, and the edited display data is stored in the second storage section. When a certain radio station group is selected from the preset memory by the selecting section, the display data stored in the first or second storage section is displayed according to the selected radio station group. This novel setup allows the user to display desired labels adapted to natures of the groups or pages registered in the preset memory of the programmed tuner.

The audio system according to the invention can use a general-purpose personal computer (PC) as the editing section. This allows the user to edit the display data very easily through GUI (Graphical User Interface). For example, the user can edit the original display data on GUI and reflects the edited display data onto the display of labels in association with the capabilities of the audio processing.

DETAILED DESCRIPTION OF THE INVENTION

This invention will be described in further detail by way of example with reference to the accompanying drawings. The present invention is not limited to the preferred embodiments to be described. The scope of the invention is defined by the appended claims, and all changes and modifications as fall within the equivalence of the scope of the claims are therefore to be embraced by the invention.

Figure 1:
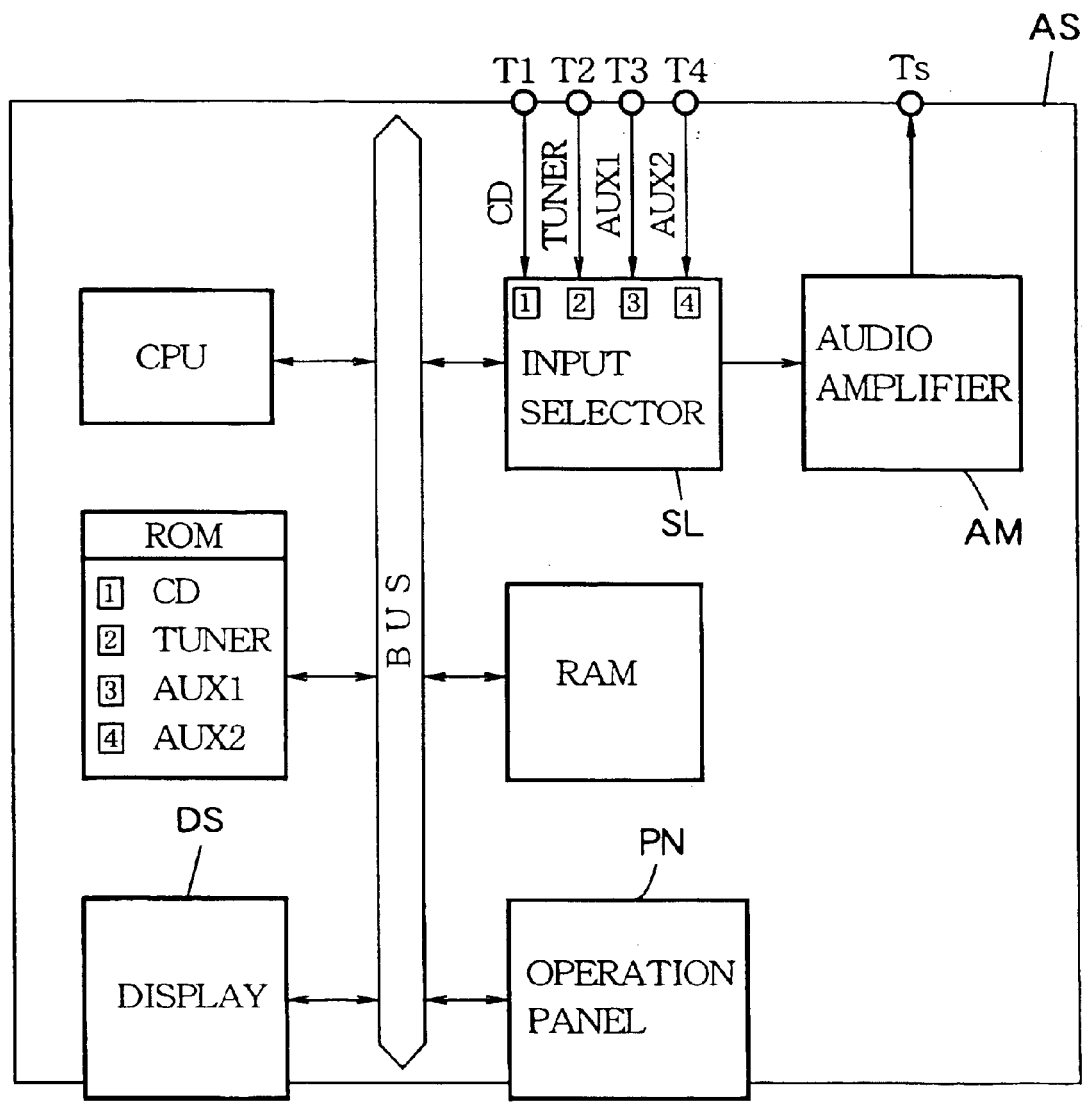
FIG. 1 is a block diagram illustrating a prior-art audio system.
Figure 2:
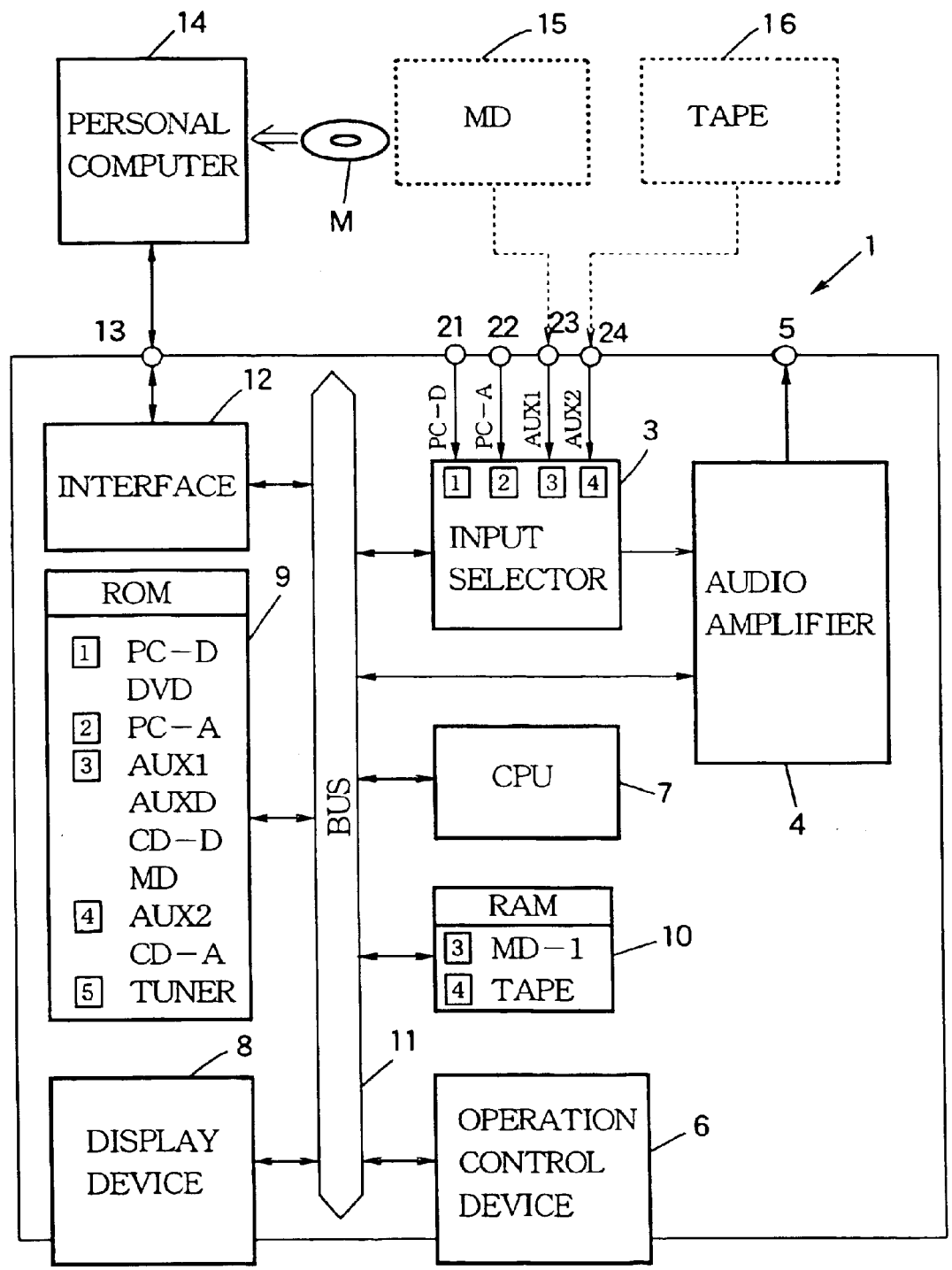
FIG. 2 is a block diagram illustrating outlined configuration of an audio system practiced as one embodiment of the invention.

FIG. 2 is a block diagram illustrating an outlined configuration of an audio system embodied by applying the invention to an audio amplifier. The audio system 1 is connected at external device connection terminals 21 through 24 arranged on a rear panel to digital or analog audio signal sources such as a personal computer (PC), a CD player, an MD (Mini Disk) player, and a tape deck. The system incorporates a tuner of radio stations as another signal source. Audio signals coming from these terminals 21 through 24 and from the incorporated tuner are selectively inputted into an audio amplifier 4 through an input selector 3. The audio signal selected by the input selector 3 is amplified by the audio amplifier 4, and the amplified audio signal is sounded from a loudspeaker through a speaker terminal 5. It should be noted that the boxed numbers "1" through "5" are used for conveniently representing input selector positions to be selected by the input selector 3, and are related to the external device connection terminals 21 through 24 and the incorporated tuner, respectively.

In the audio system 1, the input selector 3 is controlled by a central processing unit (CPU) 7 according to the operation state of an operation control device 6. The audio system 1 is also provided with a display device 8, a read-only memory (ROM) 9, and a random access memory (RAM) 10. These components 3 and 6 through 10 are interconnected through a bus 11.

The operation control device 6 has, on its front panel, various key controls of suitable forms such as switches (push buttons) and knobs (rotary selectors) for capability setting and selecting. These controls are arranged on an operator panel of the control device 6. Operating appropriate controls on the operation control device 6 can switch the audio signals among external devices connected at the connection terminals 21 through 24 and the incorporated tuner. The display device 8 has a multi-purpose display block and solid indicators each constituted by a fluorescent luminescence (FL) display element, for example. These display block and indicators are arranged on the operator panel or in the vicinity thereof.

The ROM 9 stores control programs and data necessary for controlling this audio system 1. The data include display data. The control programs include one specifying a display sequence of the display data to be displayed on the display device 8. For example, generally assumed labels or names of external devices expected to be connected are prepared as ROM data. As shown in FIG. 2, the assumed default labels can be registered in the ROM 9 in advance in correspondence to the input selector positions "1", "2" and so on, for example. A memory space that can be edited is allocated in the RAM 10 that functions as a work area. The user can enter a label as desired character strings into this work area of the RAM 10 as shown in FIG. 2.

A PC connection terminal 13 is arranged on the audio system 1, the terminal being connected to the bus 11 through an interface 12. The PC connection terminal 13 can be connected to an external personal computer (PC) 14. The ROM 9 also stores a program that allows control of the system 1 from the external PC 14 when the PC 14 is connected to the system 1. The external PC 14 allows the user not only to control the operations such as selector switching on the system 1 but also to execute character string registration into the edit area of the RAM 10 as well as data rewriting. It should be noted that the present embodiment can also be configured such that the display data to be stored in the RAM 10 can be edited, and that the contents to be displayed on the display device 8 can be changed by operating the operation control device 6 by use of the capabilities of the CPU 7 in the system 1. However, from the viewpoints of workability and flexibility of the editing operations and versatility of the edited contents, this embodiment is adapted to change the display data such as selector label data by operating the personal computer (PC) 14 connected to the system 1.

With respect to visual indication of the input devices to be connected to the audio system 1, the audio system 1 not only prepares default labels in the ROM 9 as described above, but also is adapted to allow the user to edit the display data of the labels by use of the external PC 14 and to store the edited display data into the RAM 10. In this configuration, when the user performs an input selecting operation for example by operating the operation control device 6 or the external PC 14, the specified input device is selected and the corresponding display data is selected from the ROM 9 or the RAM 10 to display the corresponding label on the display device 8. Consequently, the user can change the default labels to be displayed in correspondence to the selected capabilities to the specific customized labels by the user. The followings are some examples of specific display changing operations.

(1) To display "MD" with input selector position "3" selected:

As indicated by dashed lines shown in FIG. 2, the audio system 1 is set in advance so that the analog audio signal source of an MD player 15 is connected to the connection terminal 23 as an external device. When the user operates the operation control device 6 or the external PC 14 to select label "MD" corresponding to this external device 15 from among the candidate labels of input selector position "3" stored in the ROM 9, the data "MD" is preferentially displayed on the multi-purpose display block of the display device 8. When the audio system 1 is thus set in advance, the input selector label "MD" is preferentially displayed on the multi-purpose block of the display device 8 whenever the input selector position "3" is selected.

(2) To display "TAPE" with input selector position "4" selected:

As indicated by dashed lines shown in FIG. 2, a tape deck 16 is connected in advance to the connection terminal 24 as an external device of the signal source. The user enters a character string "TAPE" corresponding to the label of this external device 16 from the external PC 14 connected to the PC connection terminal 13. Consequently, the audio system 1 receives the custom character data "TAPE" for example, stores the received character data into the edit area in the RAM 10, and makes setting so that data "TAPE" is preferentially displayed when the input selector position "4" is selected. When the audio system 1 is thus set in advance, the input selector label "TAPE" is preferentially displayed on the multi-purpose block of the display device 8 whenever the input selector position "4" is selected.

Figure 3:
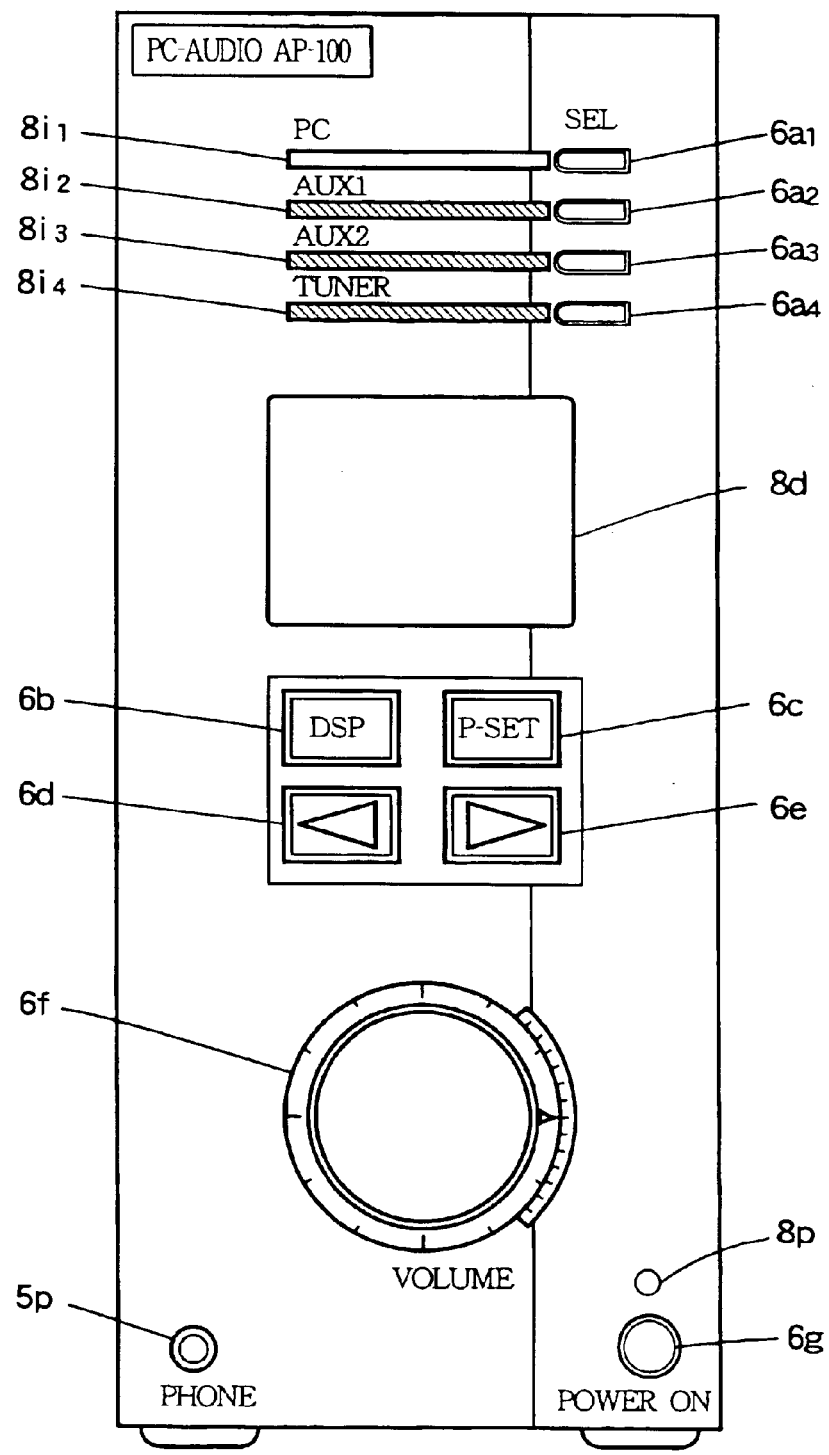
FIG. 3 is a diagram illustrating one example of a front panel of the above-mentioned embodiment.
Figure 4:
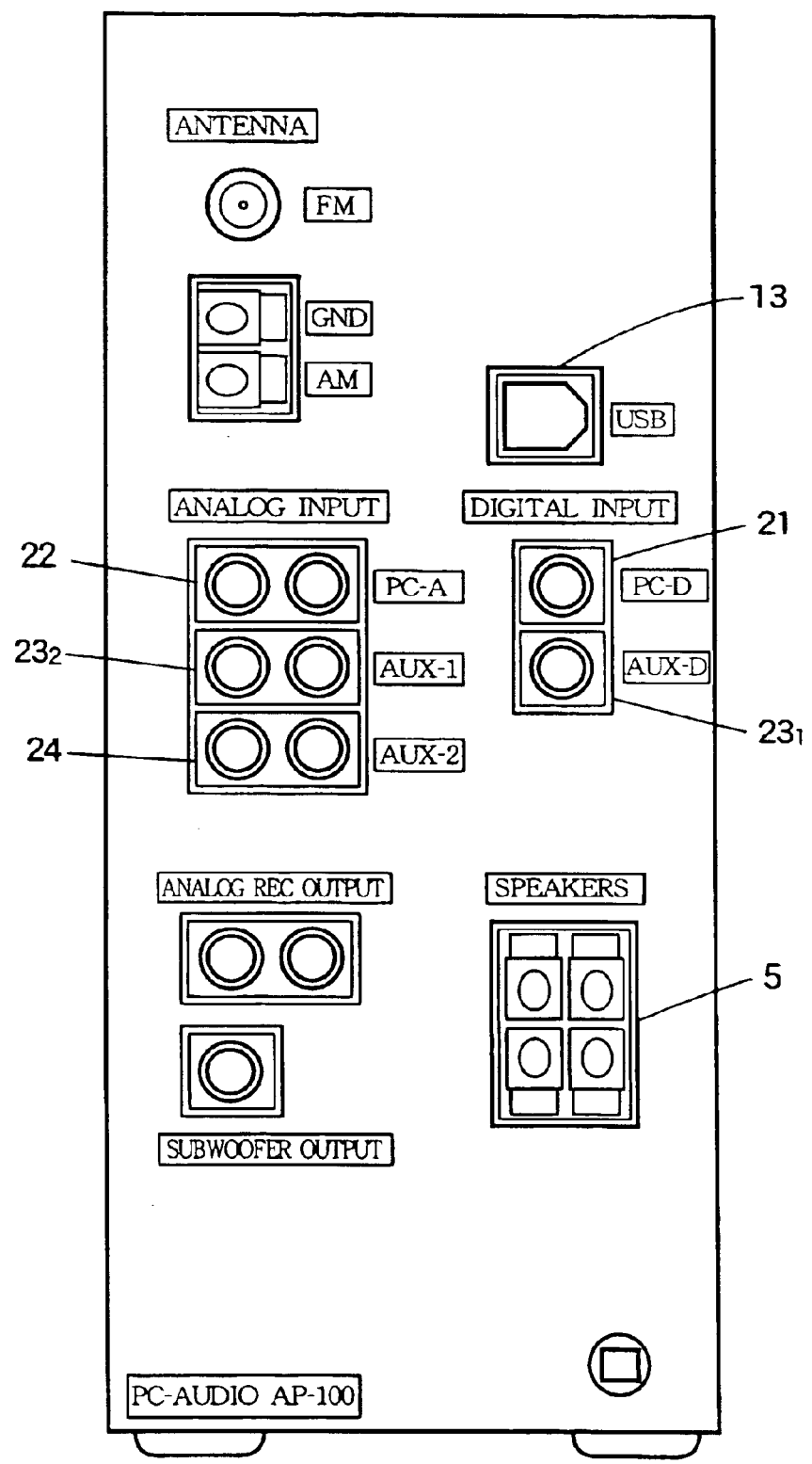
FIG. 4 is a diagram illustrating one example of a rear panel of the above-mentioned embodiment.

FIGS. 3 and 4 illustrate a front panel and a rear panel, respectively, of the audio system 1 practiced as one embodiment of the invention. In the present example, the operator block on the operation control device 6 of the front panel (FIG. 3) is composed of plural push-button input selector switches 6a1 through 6a4, a DSP switch 6b, a tuner setting switch 6c, DSP/tuner function setting up and down switches 6d and 6e, a master volume control dial 6f, a power-on/standby switch 6g, and so on. The front panel also has plural input indicators 8i1 through 8i4 and a power indicator 8p as a display portion of the display device 8 in addition to the multi-purpose display block 8d, and a head phone jack 5p for signal output.

The rear panel (FIG. 4) is composed of the connection terminals 21 through 24 for accepting the audio signals from external audio signal sources, a speaker terminal 5 for signal output to a loudspeaker, the PC connection terminal 13 for connecting this system to the external PC 14 through a USB (Universal Serial Bus) cable, an antenna terminal for connection to an FM antenna and an AM loop antenna for the tuner, a terminal for outputting the analog signal on the stage preceding the master volume, and a sub woofer output terminal.

As described above, the USB cable is used to connection for the external personal computer 14, thereby enabling data transfer between the external personal computer 14 and the audio system in two-way. Basically, one-way data transfer from the external personal computer 14 to the audio system 1 is sufficient for simply changing or correcting characters displayed on the audio system. However, in practice, the personal computer 14 executes a program of editing the display character strings, and requests the audio system 1 for information about the display character strings. In such a case, the audio system has to transfer back the requested data to the external personal computer 14. Thus, the bi-directional data transfer system including cables and interfaces such as USB is required to implement the two-way data transfer.

For example, the external personal computer may incidentally suffer from malfunctions necessitating reinstallation of application software such as the editing program of the character strings. In this case, upon the re-installation of the editing program, a setup program may access to the edited data of the character strings reserved in the audio system and may recover the character data such as selector labels from the audio system to the personal computer through the USB cable. Once the application software is installed into the personal computer and editing of the character strings is conducted by the personal computer in cooperation with the audio system, the edited character strings data is backed up by the audio system. Therefore, even if the edited data of character strings disappear and re-installation of the application software is required, the data can be readily recovered from the audio system. Thus, it is not necessary to re-input the character strings data such as selector labels from a keyboard of the personal computer.

On the other hand, in case that power supply to the audio system is discontinued over several weeks, the backup memory of the audio system may be inadvertently cleared and the saved data is erased. In such a case, the application software is booted on the personal computer so that the character data such as selector labels reserved in the personal computer can be readily loaded into the memory of the audio system main.

The input selector switches 6a1 through 6a4 and the input indicators 8i1 through 8i4 correspond one to one, labeled as "PC," "AUX1," "AUX2," and "TUNER" from top to down as shown in the figure. The input indicators 8i1 through 8i4 turn on to indicate the connection with signal sources by the corresponding input selection switches 6a1 through 6a4.

The PC input selection switch 6a1 corresponds to input selector position numbers "1" and "2", and is used for the selection of audio inputs from the personal computer (PC). Every time this switch is pressed, the system alternates between one state where a digital audio signal is received from a DVD player incorporated in the external PC connected through a "PC-D" connection terminal 21, and another state where an analog signal from a sound card incorporated in the external PC is received through a "PC-A" connection terminal 22.

The "AUX1" input selection switch 6a2 corresponds to the input selector position number "3", and is operated to select either of the digital audio signal inputted from a CD player for example through an "AUX-D" connection terminal 231 and the analog audio signal inputted from a CD player, an MD player, or a tape deck through an "AUX-1" 232. The digital signal from the terminal 231 is preferentially connected over the analog signal from the terminal 232. If there is no preferential digital input, this switch is automatically set to the analog signal input side.

The "AUX2" input selection switch 6a3 corresponds to the input selector position number "4", and is operated to select only the analog audio signal inputted from the CD player, the MD player, or the tape deck through an "AUX-2" connection terminal 24.

The "TUNER" input selection switch 6a4 corresponds to the input selector position number "5", and is operated to select the FM or AM tuner incorporated in the system 1. Every time this switch is pressed, switching between FM and AM is performed, and otherwise forcible switching to FM monaural is performed.

The DSP switch 6b turns on/off DSP capability. When this switch is turned on, a desired DSP program can be selected by operating the up and down switches 6d and 6e. The tuner setting switch 6c is used when the FM or AM tuner is selected by operating the "TUNER" input select switch 6a4. Namely, the switch can perform preset memory page call switching and manual tuning operation switching every time the switch 6c is pressed. When the DSP switch 6b is in the off state, by operating the up and down switches 6d and 6e, selection of preset memory pages or increment and decrement (tuner operations) of received frequencies can be performed dependently on the state of the tuner setting switch.

Figure 5:
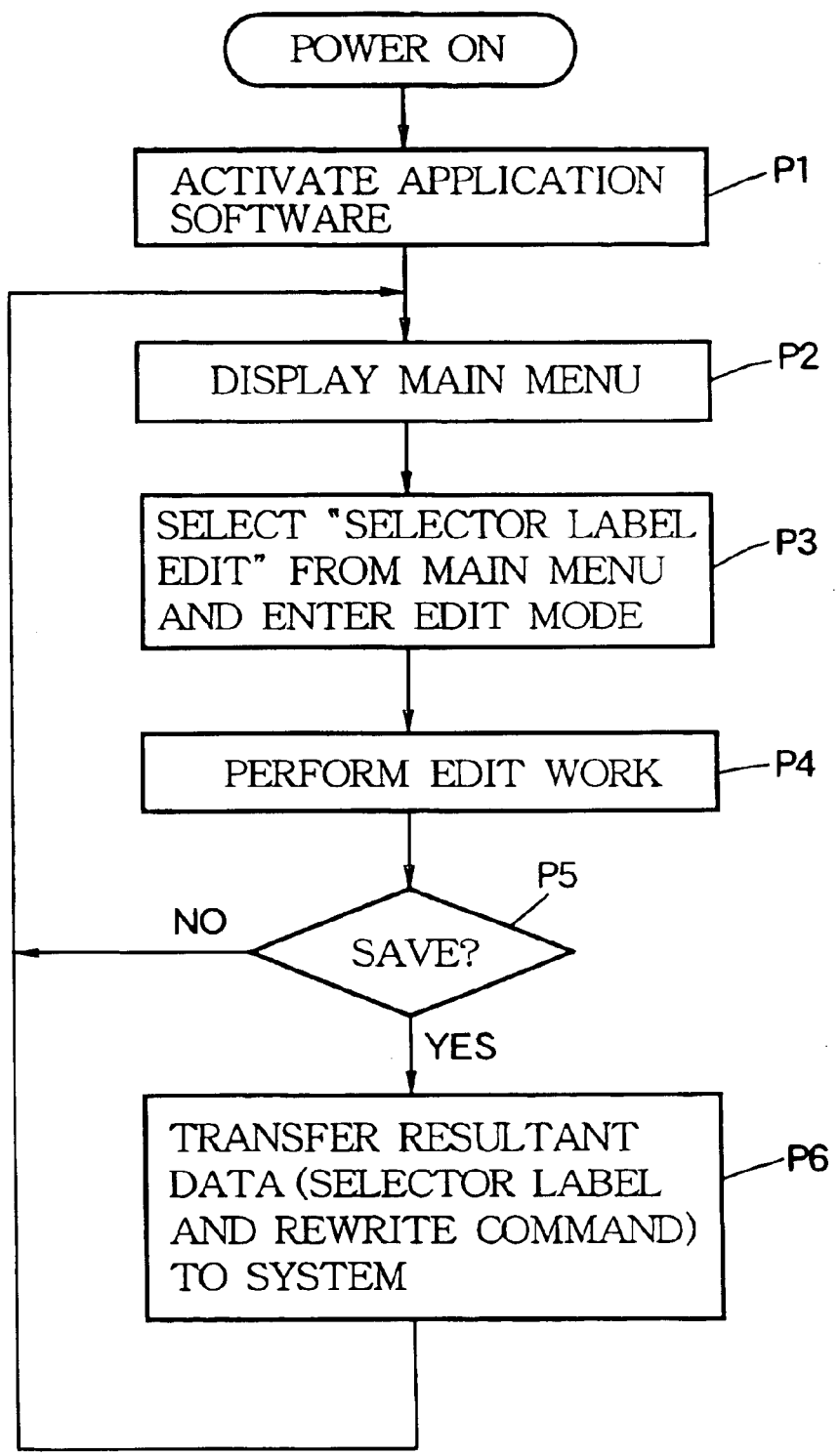
FIG. 5 is a diagram illustrating a flow of processing executed by a personal computer (PC) connected to the above-mentioned embodiment.

FIG. 5 shows one example of the processing flow executed by the external PC for controlling the audio system practiced as one example of the invention. Following this processing flow, the user can enter desired input selector labels Into the edit area in the RAM 10 of the audio system 1 by operating the external PC 14. When the external PC is powered on, an application program conducting this processing flow is activated in step P1. The application program may be provided by a machine-readable medium M such as floppy disk and CD-ROM disk, which can be loaded into a disk drive of the personal computer 14. In step P2, display processing is performed such that a main menu screen including edit items "Selector Label Edit," "DSP Mode Label Edit," "Page Label Edit" and so on is displayed on a display section of the PC 14.

Figure 6:
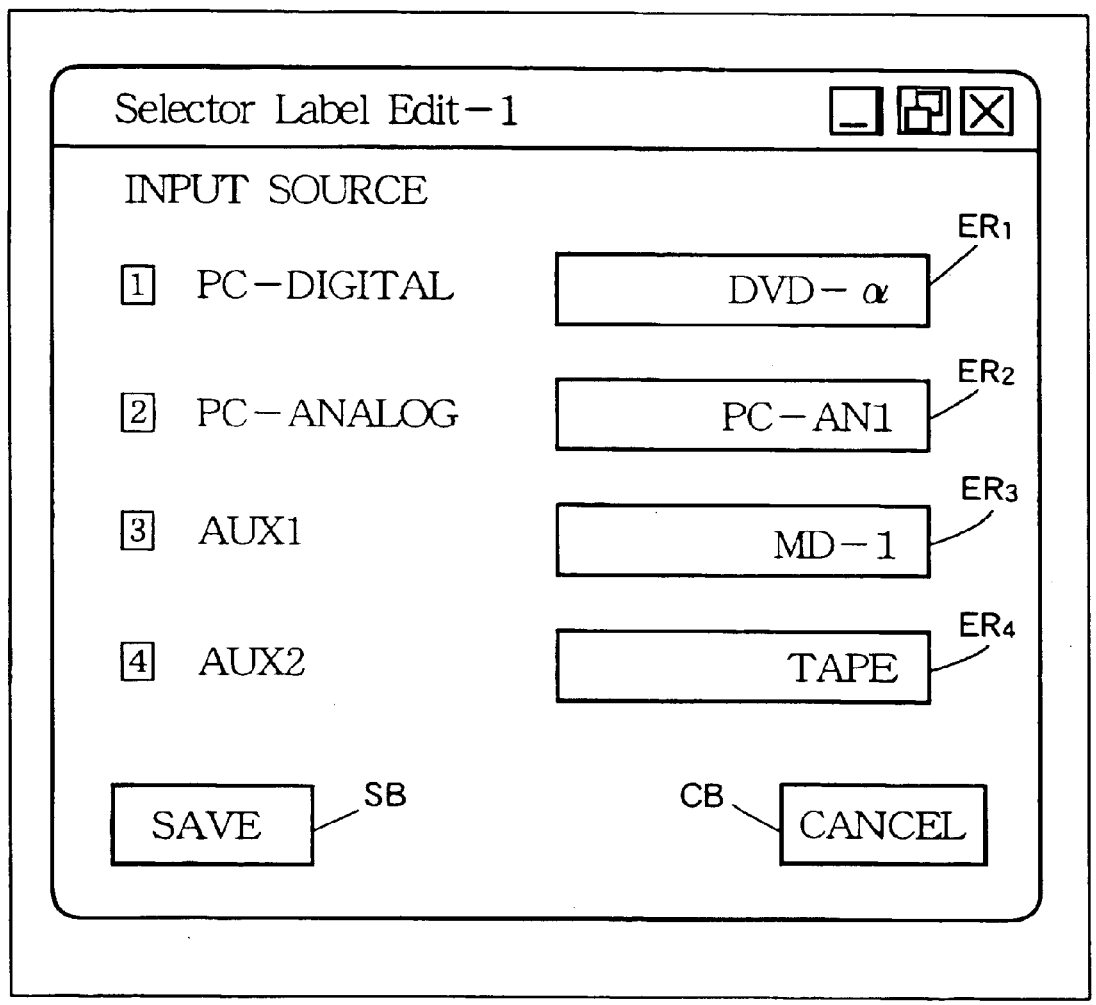
FIG. 6 is a diagram illustrating one example of display for selector label editing on the above-mentioned PC.

In step P3, if the user selects one edit item "Selector Label Edit" from this main menu, the system enters into the selector label edit mode, upon which a selector label edit mode screen as shown in FIG. 6 is displayed on the display section of the PC 14. In step P4, the user enters a desired character string representing respective selector labels into edit boxes ER1 through ER4 of the screen corresponding to the input selector position numbers "1" through "4" of the external device input terminals 21 through 24 of the audio system main 1 in order to perform the edit operation. The user can quit this edit operation by clicking a cancel button CB. In addition, by editing the displayed labels on the GUI in this edit operation, the user can reflect the edited character strings onto the display of the selector labels in the system 1.

After the edit operation is completed as described above, when the user clicks a save button SB on the screen in order to register the entered character string, the processing goes from step P5 to step P6 in which the display data determined by the character string are transferred to the system 1 along with a selector label rewrite command. In response, the system 1 can store these display data into the edit area in the RAM 10 of the system 1. Subsequently, the selector labels edited by the GUI operation are actually reflected on the display device of the system 1.

Therefore, by provisionally connecting the DVD player incorporated in the PC, the sound card also incorporated in the PC, the MD player 15, and the tape deck 16 as external signal sources to the connection terminals 21, 22, 23 (231), and 24, respectively, as shown in the above-mentioned case (2) for example, the user can register desired character strings "DVD-α," "PC-AN1," "MD-1," and "TAPE" from the PC14 into the audio system 1 for representing labels of the respective devices.

It should be noted that, if another edit item such as "DSP Mode Label Edit" or "Page Label Edit" is selected from the main menu displayed on the PC display device in step P2, the user can transfer the character string data indicative of a desired DSP mode label or page label from the external PC 14 to the audio system 1 after the similar edit operation, as described above.

Figure 7:
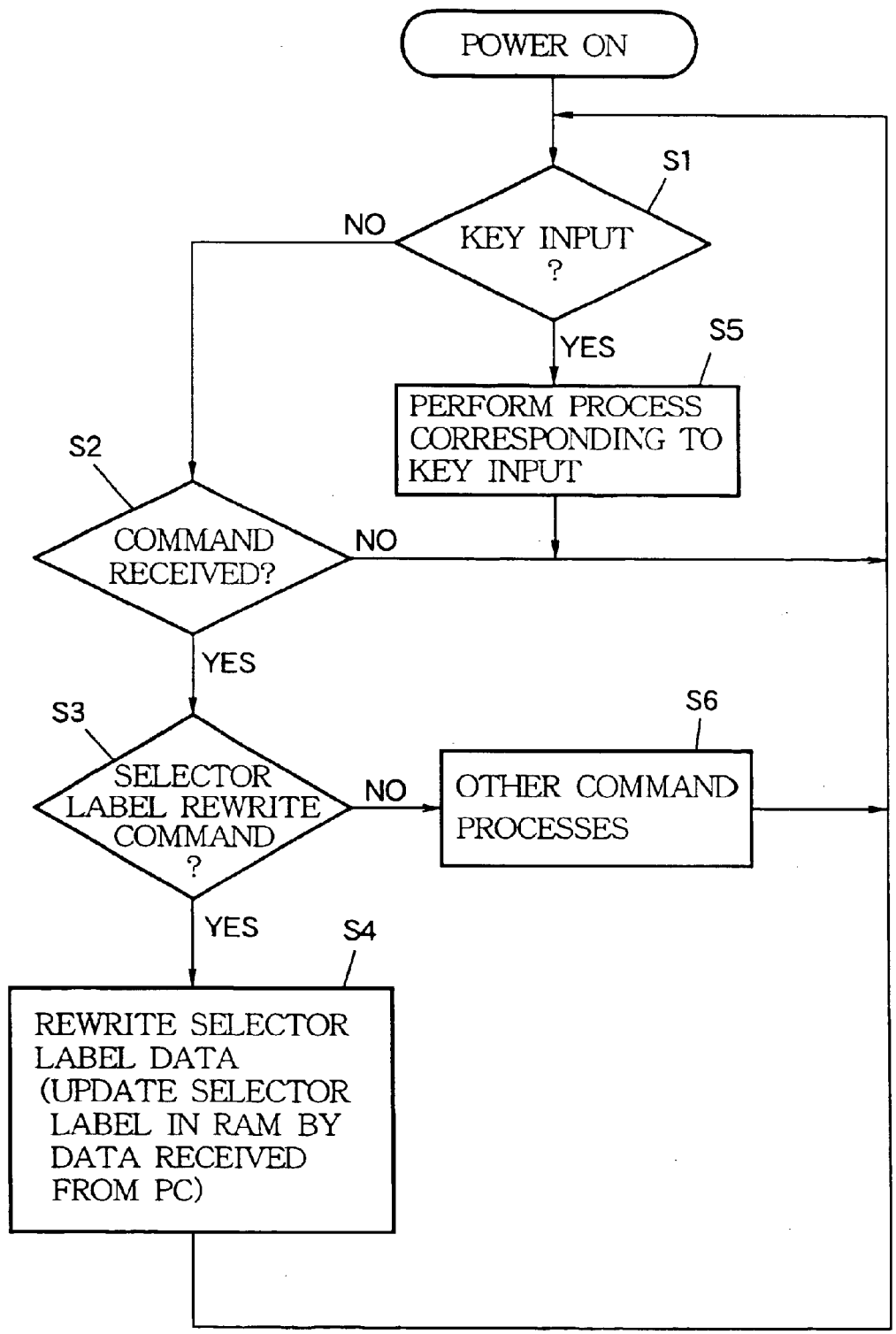
FIG. 7 is a diagram illustrating a flow of processing executed on the audio system main of the above-mentioned embodiment.

FIG. 7 is a flowchart indicative of the flow of processing executed by the system side in the audio system practiced as one embodiment of the invention. In this processing, when the user performs key input by operating one of the input selection switches 6a on the operation control device 6 of the system 1, a corresponding input selector label can be displayed on the multi-purpose display block 8d of the display device 8. When the user presses the power on/standby switch 6g and the system is powered on, the power indicator 8p turns on and, at the same time, this processing flow is activated at a predetermined clock time interval. In step S1, the system determines whether a key input operation has been made by operating any of switches 6a through 6e on the operation control device 6.

If no key input operation is detected in step S1, then the system determines in step S2 whether a command has been received from the external PC 14. If the command is found received, the system determines in step S3 whether the received command is a selector label rewrite command. If the command is found the selector label rewrite command in step S3, then the system stores the display data of the selector label transferred along with this command into the edit area in the RAM 10 allotted to the corresponding input selector position number. If the memory area corresponding to the input selector position number is already filled with data, this area is updated with the new display data. The processing in step S3 allows the user to store the above-mentioned character strings "DVD-α," "PC-AN1," "MD-1," and "TAPE" as the display data in correspondence to the input selector position numbers "1" through "4" for example.

On the other hand, if a key input operation is found performed in step S1, then the system performs an operation control response process according to the type of the key input operation in step S5, upon which the processing returns to step S1. For example, the "PC" input selection switch 6a1 of the input selection switches 6a may be operated. Every time the switch 6a1 is pressed, the system alternates between one state where a digital audio signal is received from the PC-incorporated DVD player through the "PC-D" connection terminal 21 in correspondence to the input selector position number "1", and the other state where an analog signal is received from the PC-incorporated sound card through the "PC-A" connection terminal 22 in correspondence to the input selector position number "2."

When the "AUX1" input selection switch 6a2 corresponding to the input selector position number "3" is operated, connection switching is performed such that, if a digital audio signal source such as the CD player is connected to the "AUX-D" connection terminal 231, this digital audio signal is preferentially received, and, if no digital audio signal source is connected to the connection terminal 231, an analog audio signal is received from an analog audio signal source such as the CD player, the MD player or the tape deck connected to the "AUX-1" connection terminal 232. If the "AUX2" input selection switch corresponding to the input selector position number "4" is operated, the analog audio signal inputted from the CD player, the MD player, or the tape deck through the "AUX-2" connection terminal 24 is selected. Otherwise, the "TUNER" input selection switch 6a4 corresponding to the input selector position number "5" may be operated. Every time this switch is pressed, the switching between FM and AM of the FM and AM tuners or the forcible switching to FM monaural is performed.

For example, likewise the above-described case (1), the MD player 15 may be provisionally connected only to the "AUX-1" connection terminal 232 in correspondence to the input selector position "3", and the system is set in advance such that the selector label "MD" is preferentially displayed from among the preset labels of the input selector position "3" in the ROM 9 when the "AUX1" input selection switch is operated. In such a case, an actual operation of the "AUX1" input selection switch preferentially displays the input selector label "MD" on the multi-purpose display block of the display device 8.

For example, in step S4, the PC-incorporated DVD player, the PC-incorporated sound card, the MD player 15 and the tape deck 16 are provisionally connected to the terminals 21, 22, 231, and 24, respectively, in correspondence to the input selector position numbers "1" through "4", and the system is set in advance such that character string data "DVD-α," "PC-AN1," "MD-1," and "TAPE" are stored as the selector label display data, and that these data are preferentially displayed. In such a case, the input selector labels "DVD-α," and "PC-AN1" are sequentially displayed on the multi-purpose display block 8d of the display device 8 every time the "PC" input selection switch is operated. The input selector label "MD-1" or "TAPE" is preferentially displayed every time the "AUX1" or "AUX2" input selection switch is operated.

When the DSP switch 6b is turned on, DSP program labels are sequentially displayed on the multi-purpose display block 8d every time the up and down switches 6d and 6e are operated. When the DSP switch 6b is operated again, a desired DSP program is selected. Further, when the tuner setting switch 6c is operated for the FM or AM tuner selected by the "TUNER" input selection switch 6a4, preset memory page call switching and manual tuning operation switching are executed every time the switch 6c is operated. When the up and down switches 6d and 6e are operated, preset memory number (page) selection or receiving frequency up/down (tuner operation) is executed depending on the state of the tuner setting switch 6c.

If, in step S3, the received command is found other than a selector label rewrite command, the processing for the received command is executed in step S6 and then the processing of step S1 is resumed. The processing for commands other than the selector label rewrite command includes the processing for an operator control response command taken in place of the operation of the operation control device 6, and other label rewrite commands such as a DSP mode label rewrite command and a page label rewrite command. In the case of the operator control response command, the similar operation to the operator control response processing as described in step S5 is executed by the key input operation of the external PC 14. In the case of the label rewrite command, registration/update of DSP mode label or the page label on the RAM 10 is executed by the processing similar to that of step S4.

Figure 8:
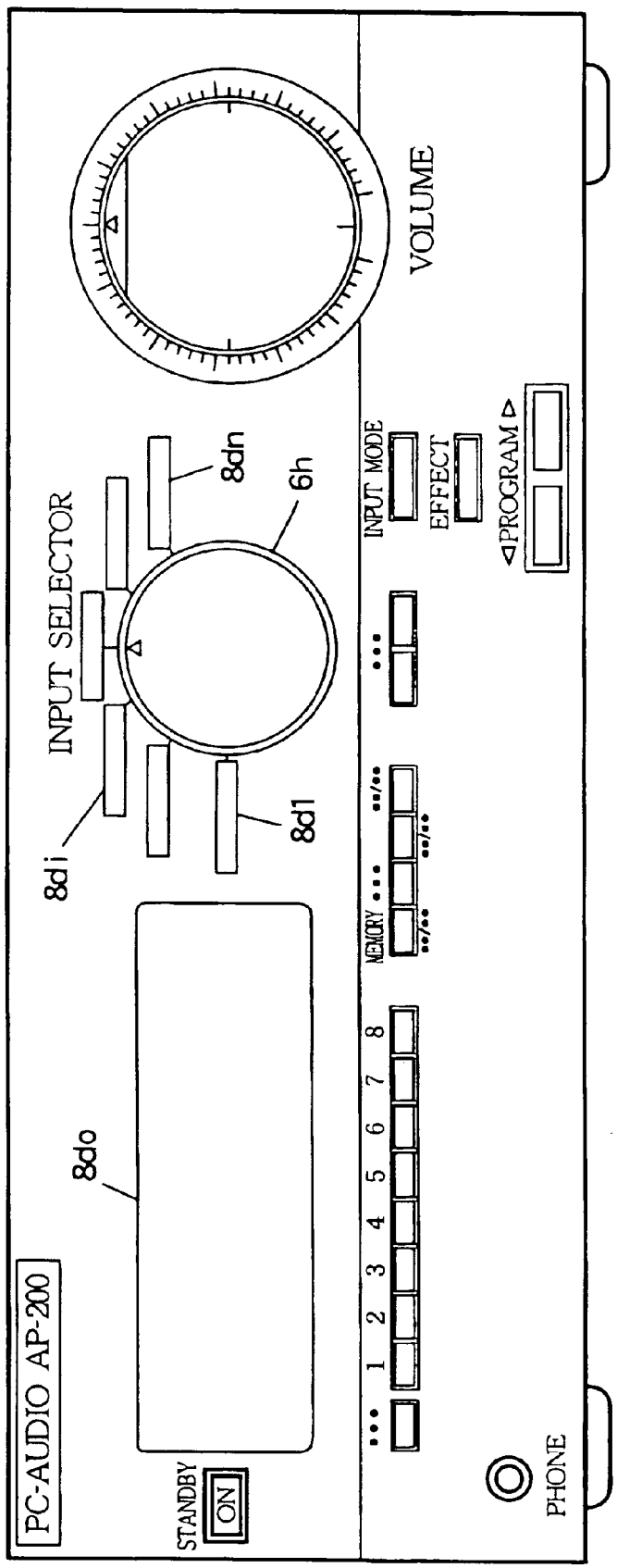
FIG. 8 is a diagram illustrating another example of the front panel of the above-mentioned embodiment.

FIG. 8 illustrates another example of the front panel of the audio system according to the invention. In this example, the operation control device 6 has a rotary input selection switch 6h instead of a set of the input selection switches 6a shown in FIG. 3, and the display device 8 has plural display blocks 8di (i=1, . . . , i, . . . , n) dedicated to respective signal sources in correspondence to the selector positions of the switch 6h, in addition to a multi-purpose display block 8d0. The rotary selector switch 6h is used to designate a signal source by the rotation position. An audio signal is inputted from a signal source designated according to the selector position of the switch 6h. Each of display blocks 8di is used to individually present the selector label of a corresponding signal source.

When the switch 6h is not operated, the display blocks 8di are off (blank). According to the knob operation of the switch 6h, the indicators at the specified rotary positions initially indicate the same contents as conventionally fixed display contents, of ready made selector labels such as "PHONE," "CD," "TAPE/MD," "DVD/LAD," "TV/DBMS," and "VCR" for example (namely the default labels printed on the rear panel are displayed without change). However, once the selector label editing has been performed according to the invention, the user can display the selector labels set by the user as desired by this editing onto the corresponding indicators 8di in response to the designating operation of the switch 6h. It is also practicable for the display blocks 8di to remain in the state where they are normally displayed at the lowest visible brightness as far as the switch 6h is not operated rather than turning off them (blank). When the switch 6h is operated, the corresponding display block 8di is highlighted.

For displaying the DSP mode labels, the system prepares the mode label display data corresponding to the sound effect modes in the ROM 9 such that DSP sound effect labels "HALL," "JAZZ," "GHURCH," "ENTERTAINMENT," "MOVIE THEATER," and "CONCERT VIDEO" for example are displayed on the display device 8 according to the operation of the mode setting keys (6b, 6d, and 6e). Otherwise, by use of the PC 14, the user can edit the mode labels as desired into "BUDOKAN," "MADISON SQUARE GARDEN" and so on for example by selecting the edit item "Edit DSP Mode Label" from the main menu displayed on the PC display device in step P2 as described above, and sets the edited mode labels to the RAM 10 of the audio system 1 as the custom mode label display data. Consequently, when performing the mode selection by operating the mode setting key, the user can preferentially display the user-customized mode labels on the multi-purpose display block 8d of the display device 8.

For displaying the tuner page labels or the group labels, the system prepares the preset page label display data in the ROM 9 so that default page labels "Page A," "Page B," and so on are displayed on the display device 8 according to the operation of the group switching keys (6a4, 6d, and 6e). At the same time, by the use of the PC 14, the user can edit the page labels as desired into "rock," "jazz," "j-pop" and so on by selecting the edit item "Edit Page Label" from the main menu displayed on the PC display device in step P2 as described above, and can set the edited page labels to the RAM 10 of the audio system 1 as the custom page label display data. Consequently, when performing the page selection by operating the page switching keys, the user can display as desired the user-customized page labels on the multi-purpose display block 8d of the display device 8.

Referring back again to FIG. 2, a machine-readable medium M such as floppy disk and CD-ROM disk can be used in the audio system 1 controllable by the personal computer 14 and having various capabilities of processing an audio signal. The medium M contains program instructions executable by the personal computer 14 for causing the audio system 1 to perform a process of providing visual indication of the capabilities by means of labels. The process is performed by the steps of accessing display data provisionally stored in a first storage composed of ROM 9, the display data being representative of original ones of the labels corresponding to the capabilities provided by the audio system 1, editing the display data so that the labels can be customized in association with the corresponding capabilities, storing the edited display data in a second storage composed of RAM 10, and displaying the labels according to the display data stored in either of the first storage and the second storage. Further, the process comprises the step of selecting one of the capabilities provided by the audio system 1 so that the label corresponding to the selected capability is displayed. For one example, the machine-readable medium M may be used in the audio system 1 having capabilities of inputting an audio signal from different types of signal sources. In such a case, the step of provisionally storing stores display data representative of labels corresponding to the types of the signal sources, and the step of selecting selects one type of the signal sources to input the audio signal so that the label corresponding to the selected type of the signal source is displayed according to the display data. For another example, the machine-readable medium M may be used in the audio system 1 having capabilities of applying different modes of sound effects to an audio signal. In such a case, the step of provisionally storing stores display data representative of labels corresponding to the modes of the sound effects, and the step of selecting selects one mode of the sound effects to process the audio signal so that the label corresponding to the selected mode of the sound effect is displayed according to the display data. For still another example, the machine-readable medium M may be used in the audio system 1 having capabilities of presetting different groups of radio stations for enabling a tuner of the audio system 1 to receive an audio signal from a radio station belonging to a preset group. In such a case, the step of provisionally storing stores display data representative of labels corresponding to the groups of the radio stations, and the step of selecting selects one group of the radio stations to receive an audio signal from a radio station belonging to the selected group so that the label corresponding to the selected group is displayed according to the display data.

As mentioned above and according to the invention, customized display data obtained by editing original display data corresponding to various system capabilities are stored in a storage section while another storage section storing the original display data is further provided. The novel constitution allows the user to edit as desired the display data into custom labels actually adapted to the capabilities or into any favorite labels. Also, for the display data not chanted, the user can use the original default labels without change. In addition, the user can automatically display the display data recorded or stored in either of the storage sections according to the capability selecting operation.

Further, the present invention is applicable to the setting of input selectors, DSP modes, and tuner pages, for example. For the input selectors, the user can change nominal labels into those of actually connected devices or those desired by the user. This allows the user to instantly recognize what device is connected to which connector by looking at the display. For the DSP modes, the user can provide the labels as desired. For the tuner program memory pages, the user can provide labels as desired according to the actual memory contents. Thus, the novel constitution allows the user to have displays adapted to particular capabilities actually selected or set or displays to the user's liking.

In addition, the prevent invention significantly facilitates display data editing works performed by the user as editing the display labels on GUI into those associative with capabilities of the system by performing the display data editing through GUI operations by use of a general-purpose personal computer.

What is claimed is:

1. An audio system having various kinds of capabilities of processing an audio signal with visual indication of the capabilities by labels, the audio system comprising:
   a main section that provides the capabilities of processing the audio signal;
   an editing section, in a device physically separate from the main section, that is operated to edit display data to provide edited display data representative of a label corresponding to a capability of processing the audio signal provided by the main section and to output the edited display data representative of the label corresponding to the capability;
   a storage section that receives the edited display data and that stores the edited display data; and
   a display section, which is in a same device as the main section and the storage section, and is in a device separate from the editing section, that displays the label according to the edited display data stored in the storage section so that the displayed label can be customized in association with the corresponding capability.

2. An audio system having various kinds of capabilities of processing an audio signal with visual indication of the capabilities by labels, the audio system comprising:
   a main section that provides the capabilities of processing the audio signal;
   a first storage section that provisionally stores display data representative of labels corresponding to the capabilities provided by the main section;
   an editing section, in a device physically separate from the main section, that is operated to edit the display data to provide edited display data so that the labels can be customized in association with the corresponding audio processing capabilities of the main section and to output the edited display data;
   a second storage section that stores the edited display data; and
   a display section, which is in a same device as the main section, the first storage section, and the second storage section, and is in a device separate from the editing section, that can display the labels according to the display data stored in either the first storage section or the second storage section.

3. An audio system having a plurality of capabilities of processing an audio signal with visual indication of the capabilities by labels, the audio system comprising:
   a main section that selectively provides the capabilities of processing the audio signal;
   a first storage section that provisionally stores display data representative of labels corresponding to the capabilities;
   an editing section, in a device physically separate from the main section, that is operated to edit the display data to provide edited display data so that the labels can be customized in association with the audio processing capabilities of the main section and to output the edited display data;
   a second storage section that stores the edited display data;
   a selecting section that selects one of the capabilities; and
   a display section, which is in a same device as the main section, the first storage section, and the second storage section; and is in a device separate from the editing section, that displays a label corresponding to the selected one of the capabilities according to the display data stored in either the first storage section or the second storage section.

4. An audio system capable of processing an audio signal inputted from different types of signal sources with visual indication of the signal sources by labels, the audio system comprising:
   a first storage section that provisionally stores display data representative of labels corresponding to the signal sources;
   an editing section that is operated to edit the display data to provide edited display data so that the labels can be customized in association with the different types of the signal sources;
   a second storage section that stores the edited display data;
   a selecting section that selects one type of the different types of the signal sources to input the audio signal; and
   a display section that displays a label corresponding to the selected one type of the signal sources according to the display data stored in either the first storage section or the second storage section, wherein the editing section is external to the selecting section and the display section,
   wherein the selecting section, display section, the first storage system, and the second storage system are located in a first apparatus, and the different types of signal sources are physically connected to the first apparatus through external device connection interfaces not including a radio frequency interface and separate from a personal computer connection terminal.

5. An audio system capable of applying different modes of sound effects to an audio signal with visual indication of the sound effects by labels, the audio system comprising:
   a main section that provides the capabilities of processing the audio signal;
   a first storage section that provisionally stores display data representative of labels corresponding to the modes of the sound effects;
   an editing section, in a device physically separate from said main section, that is operated to edit the display data to provide edited display data so that the labels can be customized in association with the modes of the sound effects;

a second storage section that stores the edited display data;

a selecting section that selects one mode of the modes of the sound effects to process the audio signal; and a display section, which is in a same device as the main section, the first storage section, and the second storage section, and is in a device separate from the editing section, that displays a label corresponding to the selected one mode of the modes of the sound effects according to the display data stored in either the first storage section or the second storage section, wherein the editing section is external to the selecting section and the display section.

6. An audio system capable of presetting different groups of radio stations for enabling a tuner to receive an audio signal from a radio station of a preset group with visual indication of the group by a label, the audio system comprising:

a main section that provides capabilities of processing the audio signal;

a first storage section that provisionally stores display data representative of labels corresponding to the groups of the radio station;

an editing section, in a device physically separate from the main section, that is operated to edit the display data to provide edited display data so that the labels can be customized in association with the groups of the radio stations;

a second storage section that stores the edited display data;

a selecting section that selects one group of the groups of the radio stations to receive an audio signal from a radio station belonging to the selected one group; and a display section which is in a same device as the main section, the selecting section, the first storage section, and the second storage section, and is in a device separate from the editing section, that displays a label corresponding to the selected one group according to the display data stored in either the first storage section or the second storage section, wherein the editing section is external to the selecting section and the display section.

7. A display method performed in an audio system having various kinds of capabilities of processing an audio signal, for providing visual indication of the capabilities by labels, the display method comprising the steps of:

editing display data at an editing section, in a device physically separate from a main section, to provide edited display data representative of a label corresponding to an audio processing capability provided by the audio system;

outputting the edited display data to the main section external to the editing section that provides the capabilities of processing the audio;

storing the edited display data in a storage; and displaying, at a display section which is in a same device as the main section, and is in a device separate from the editing section, the label according to the edited display data stored in the storage so that the displayed label can be customized in association with the corresponding capability.

8. A display method performed in an audio system having various kinds of capabilities of processing an audio signal, for visual indication of the capabilities by labels, the display method including:

provisionally storing display data in a first storage, the display data being representative of original ones of the labels corresponding to the capabilities provided by the audio system;

editing the display data in an editing section, in a device physically separate from a main section, to provide edited display data so that the labels can be customized in association with the corresponding audio processing capabilities;

outputting the edited display data to the main section external to the editing section that provides the capabilities of processing the audio;

storing the edited display data in a second storage; and displaying, at a display section which is in a same device as the main section, and is in a device separate from the editing section, the labels according to the display data stored in either the first storage or the second storage.

9. The display method as claimed in claim 8, further including selecting one of the capabilities provided by the audio system so that a label corresponding to the selected one of the capabilities is displayed.

10. The display method as claimed in claim 9, further including provisionally storing display data representative of labels corresponding to different modes of sound effects, and selecting one mode of the different modes of the sound effects to process the audio signal so that a label corresponding to the selected one mode of the different modes of the sound effects is displayed according to the display data.

11. The display method as claimed in claim 9, further including provisionally storing display data representative of labels corresponding to different preset groups of the radio stations, and selecting one group of the different preset groups of the radio stations to receive an audio signal from a radio station belonging to the selected one group so that the label corresponding to the selected one group is displayed according to the display data.

12. A display method performed in an audio system having various kinds of capabilities of inputting an audio signal from different types of signal sources, for visual indication of the capabilities by labels, the display method including:

provisionally storing display data in a first storage, the display data being representative of original ones of the labels corresponding to the capabilities of inputting an audio signal from different types of signal sources provided by the audio system;

editing the display data in an editing section to provide edited display data so that the labels can be customized in association with the corresponding capabilities;

outputting the edited display data to a main section external to the editing section that provides the capabilities of inputting the audio signal from different types of signal sources;

storing the edited display data in a second storage;

displaying, at a display section which is in a same device as the main section, and is in a device separate from the editing section, the labels according to the display data stored in either the first storage or the second storage;

selecting one type of the different types of the signal sources to input the audio signal so that a label corresponding to the selected one type of the different types of the signal sources is displayed according to the display data; wherein the main section, the selecting section, and the display section are located in a first apparatus, and the different types of signal sources are physically connected to the first apparatus through external device connection interfaces not including a radio frequency interface and separate from a personal computer connection terminal.

13. A machine-readable medium for use in an audio system controllable by a personal computer and having various capabilities of processing an audio signal, the medium containing program instructions executable by the personal computer for causing the audio system to perform a process of providing visual indication of the capabilities by labels, wherein the process includes:

editing display data in an editing system, in a device physically separate from a main section, to provide edited display data representative of a label corresponding to an audio processing capability provided by the audio system;

outputting the edited display data to the main section external to the editing section that provides the capabilities of processing the audio;

storing the edited display data in a storage; and displaying, at a display section which is in a same device as the main section, and is in a device separate from the editing section, the label according to the edited display data stored in the storage so that the displayed label can be customized in association with the corresponding capability.

14. A machine-readable medium for use in an audio system controllable by a personal computer and having various capabilities of processing an audio signal, the medium containing program instructions executable by the personal computer for causing the audio system to perform a process of providing visual indication of the capabilities by means of labels, wherein the process includes:

accessing display data provisionally stored in a first storage, the display data being representative of original ones of the labels corresponding to the capabilities provided by the audio system;

editing the display data in an editing section, in a device physically separate from a main section, to provide edited display data, so that the labels can be customized in association with the corresponding capabilities of processing an audio signal;

outputting the edited display data to the main section external to the editing section that provides the capabilities of processing the audio;

storing the edited display data in a second storage; and displaying, at a display section which is in a same device as the main section, and is in a device separate from the editing section, the labels according to the display data stored in either the first storage or the second storage.

15. The machine-readable medium as claimed in claim 14, wherein the process further includes selecting one of the capabilities provided by the audio system so that the label corresponding to the selected capability is displayed.

16. The machine-readable medium as claimed in claim 15 including provisionally storing display data representative of labels corresponding to different modes of the sound effects, and selecting selects one mode of the different modes of the sound effects to process the audio signal so that a label corresponding to the selected one mode of the different modes of the sound effects is displayed according to the display data.

17. The machine-readable medium as claimed in claim 15, including provisionally storing display data representative of labels corresponding to different preset groups of the radio stations, and selecting one group of the different preset groups of the radio stations to receive an audio signal from a radio station belonging to the selected one group so that a label corresponding to the selected one group is displayed according to the display data.

18. A machine-readable medium for use in an audio system controllable by a personal computer and having various capabilities of inputting an audio signal from different types of signal sources, the medium containing program instructions executable by the personal computer for causing the audio system to perform a process of providing visual indication of the capabilities by means of labels, wherein the process includes:

accessing display data Provisionally stored in a first storage, the display data being representative of original ones of the labels corresponding to the capabilities of inputting the audio signal from the different types of signal sources provided by the audio system:

editing the display data in an editing section, to provide edited display data, so that the labels can be customized in association with the corresponding capabilities;

outputting the edited display data to a main section external to the editing section that provides the capabilities of inputting an audio signal from different types of signal sources;

storing the edited display data in a second storage;

displaying, at a display section which is in a same device as the main section, and is in a device separate from the editing section, the labels according to the display data stored in either the first storage or the second storage; and selecting one type of the different types of the signal sources to input the audio signal so that a label corresponding to the selected one type of the different types of the signal sources is displayed according to the display data, wherein the main section, the selecting section, and the display section being located in a first apparatus, and the different types of signal sources being physically connected to the first apparatus through external device connection interfaces not including a radio frequency interface and separate from a personal computer connection terminal.

19. An audio apparatus having various kinds of capabilities of processing an audio signal with visual indication of the capabilities by labels, the audio apparatus comprising:

an operation control device to set and select the various kinds of capabilities of processing the audio signal with visual indication of the capabilities by labels;

a first interface for connection with an external editing system to receive edited display data from the external editing system;

a second interface, physically separate from the first interface, for connection with at least one audio signal source, the at least one audio signal source providing the audio signal and the at least one audio signal source not being a radio frequency broadcast;

a storage section that stores the edited display data; and a display section that displays the labels according to the edited display data stored in the storage section so that the displayed labels can be customized in association with the corresponding capability of the audio signal source.

20. The audio apparatus of claim 19, wherein the first interface for connection with the external editing system operates in accordance with the Universal Serial Bus (USB) protocol.

21. The audio apparatus of claim 19, wherein the first interface for connection with the external editing system operates in accordance with network protocols or in accordance with wireless communication protocols.

22. The audio apparatus of claim 19, further including an input selector to select one type of the capabilities of processing the audio signal.

23. The audio apparatus of claim 19, further including an audio amplifier to amplify the audio signal and to sound the audio signal from a loudspeaker through a speaker terminal.

24. The audio apparatus of claim 19, further including an internal editing device to edit display data and to transfer the edited display data to the storage section.

25. An audio apparatus for processing an audio signal inputted from different types of signal sources with visual indication of the different types of signal sources by labels, the audio apparatus comprising:

a first storage section that provisionally stores display data representative of labels corresponding to the signal sources;

a first interface for connection with an external editing system to receive edited display data so that the labels can be customized in association with the types of signal sources;

a second interface, physically separate from the first interface, for connection with at least one audio signal source of the different types of signal sources, the at least one audio signal source providing the audio signal and the at least one audio signal source not being a radio frequency broadcast;

a second storage section that stores the edited display data;

a selecting section that selects one type of the different types of the signal sources to input the audio signal; and a display section that displays a label corresponding to the selected type of the different types of the signal sources according to the display data stored in either the first storage section or the second storage section.

26. An apparatus capable of applying different modes of sound effects to an audio signal with visual indication of the different modes of the sound effects by labels, the audio system comprising:

a first storage section that provisionally stores display data representative of labels corresponding to the different modes of the sound effects;

a first interface for connection with an external editing system to receive edited display data so that the labels can be customized in association with the different modes of the sound effects;

a second interface, physically separate from the first interface, for connection with at least one audio signal source, the at least one audio signal source providing the audio signal and the at least one audio signal source not being a radio frequency broadcast;

a second storage section that stores the edited display data;

a selecting section that selects one mode of the different modes of the sound effects to process the audio signal; and a display section that displays the label corresponding to the selected one mode of the different modes of the sound effects according to the display data stored in either the first storage section or the second storage section.

27. An apparatus capable of presetting different groups of radio stations for enabling a tuner to receive an audio signal from a radio station of a preset group with visual indication of the preset different groups by a label, the audio system comprising:

a first storage section that provisionally stores display data representative of the labels corresponding to the preset different groups of the radio station;

an interface to connect to an external editing section that is operated to edit the display data so that the labels can be customized in association with the preset different groups of the radio stations;

a second storage section that stores the edited display data;

a second interface, physically separate from the first interface, for connection with at least one audio signal source, the at least one audio signal source providing the audio signal and the at least one audio signal source not being a radio frequency broadcast;

a selecting section that selects one group of the preset different groups of the radio stations to receive an audio signal from a radio station belonging to the selected one group; and a display section that displays the labels corresponding to the selected one group according to the display data stored in either the first storage section or the second storage section.

* * * * *